United States Patent
McKeever

(10) Patent No.: US 6,180,319 B1
(45) Date of Patent: Jan. 30, 2001

(54) PROCESS FOR THE CONTINUOUS LIQUID PROCESSING OF PHOTOSENSITIVE COMPOSITIONS HAVING REDUCED LEVELS OF RESIDUES

(75) Inventor: Mark R. McKeever, Sayre, PA (US)

(73) Assignee: E. I. du Pont de Nemours and Company, Wilmington, DE (US)

(*) Notice: Under 35 U.S.C. 154(b), the term of this patent shall be extended for 0 days.

(21) Appl. No.: 09/038,584

(22) Filed: Mar. 11, 1998

(51) Int. Cl.⁷ .................................................. G03C 5/00
(52) U.S. Cl. ..................... 430/311; 430/325; 430/326; 430/331
(58) Field of Search ................. 430/5, 300, 311, 430/322, 325, 326, 331

(56) References Cited

U.S. PATENT DOCUMENTS

| | | | |
|---|---|---|---|
| 4,311,783 | * 1/1982 | Dessauer | 430/346 |
| 4,622,286 | * 11/1986 | Sheets | 430/343 |
| 5,741,621 | * 4/1998 | Kempf et al. | 430/262 |
| 5,792,589 | * 8/1998 | Udagawa et al. | 430/270.1 |

OTHER PUBLICATIONS

Patent Abstracts of Japan, vol. 095, No. 004, May 31, 1995 & JP 07 010913 A (Mitsuibishi Kasei Corp.) Jan. 13, 1995.

Database WPI, Section Ch, Week 8736, Derwent Publications Ltd., London, GB; Class A60, AN 87–253367, XP002105416 & JP 62 174204 A (Toyobo KK), Jul. 31, 1987.

* cited by examiner

Primary Examiner—Christopher G. Young

(57) ABSTRACT

Minimization of developed photosensitive compositions is realized through use of a photoinitiator of hexaarylbiimidazole compound having at least one hydrophilic group.

19 Claims, No Drawings

PROCESS FOR THE CONTINUOUS LIQUID PROCESSING OF PHOTOSENSITIVE COMPOSITIONS HAVING REDUCED LEVELS OF RESIDUES

FIELD OF THE INVENTION

This invention relates to a process for developing and/or stripping aqueous-developable photosensitive compositions in which less residue, or sludge, is produced. More specifically, it is related to such processes in which the photosensitive composition includes a hexaarylbiimidazole photoinitiator.

BACKGROUND OF THE INVENTION

Photosensitive compositions are well known and are useful as photoresists in the formation of printed circuit materials, in the formation of lithographic printing plates, and in proofing applications. In such systems, actinic radiation impinges on a material containing photoactive components to induce a physical or chemical change in that material. The latent image thereby produced can then be processed to form a patterned mask or an image. The photosensitive systems can be positive-working or negative-working. In positive-working systems, the areas exposed to actinic radiation are removed in the post-exposure processing step; in negative-working systems, the areas not exposed to actinic radiation are removed. Particularly useful compositions are negative-working photopolymerizable and/or photocrosslinkable compositions, hereinafter referred to collectively as "photopolymerizable." In such systems, exposure to actinic radiation initiates polymerization and/or crosslinking reactions, resulting in insolubilization of the material in suitable developer solvents. The latent image is developed by treating with the developer solvent. The photopolymerizable compositions generally contain a binder, a monomeric or oligomeric material capable of polymerizing and/or cross-linking, and a photoinitiator.

In recent years there has been increased emphasis on aqueous-developable, or aqueous-processable, compositions. Such compositions have significant advantages in terms of lower costs and environmental safeguards. Aqueous-developable systems frequently use binders having acid groups which are removable in aqueous alkaline solution. In continuous processes for the production of printed circuit materials, lithographic printing plates and proofing materials, the developer solution is recycled and used repeatedly in the development step. A problem has been the accumulation of residues, known collectively as "sludge," in the recycled developer. This sludge reduces the amount of time the developer can be used without clean up and thus reduces efficiency. Furthermore, the sludge can be intractable and difficult to remove.

Frequently, after the photoresist has served its purpose, it is removed from the substrate in what is known as a stripping step. There can also be an accumulation of sludge in the stripping solution.

It would be desirable to have a process for processing aqueous-processable photopolymerizable compositions which results in lower sludge accumulation.

SUMMARY OF THE INVENTION

This invention relates to a process for producing a pattern on a substrate, said process producing less sludge. The process comprises the steps:

(a) applying an aqueous-developable photoresist to a surface of a first substrate, said photoresist comprising a photoinitiator;

(b) imagewise exposing to actinic radiation to produce exposed and non-exposed areas in the photoresist;

(c) treating the imagewise exposed photoresist with a sample of aqueous alkaline solution, resulting in removal of either the exposed or the non-exposed areas of the photoresist; and (d) repeating steps (a) to (c) at least 5 times, wherein each repetition uses a new sample of photoresist and a new substrate and essentially the same sample of aqueous alkaline solution;

wherein the photoinitiator comprises at least one hexaarylbiimidazole compound having at least one hydrophilic group, and wherein treatment of 3 grams of unexposed photoresist with 100 grams of the aqueous alkaline solution produces less than 0.05 grams precipitate.

In a second embodiment, this invention relates to a process for removing a pattern of processed photoresist from a substrate, said process comprising the steps:

(a) treating the processed photoresist with a sample of a stripper solution, resulting in removal of the photoresist mask; and (b) repeating step (a) at least 5 times, wherein each repetition uses a new substrate and processed photoresist and essentially the same sample of stripper solution;

wherein the photoresist comprises at least one hexaarylbiimidazole compound having at least one hydrophilic group, and wherein treatment of 3 grams of processed photoresist with 100 grams of the stripper solution produces less than 0.05 grams precipitate.

DESCRIPTION OF THE PREFERRED EMBODIMENTS

The process of the invention is a continuous process for the development of aqueous-developable photoresists in which less sludge is produced. By "aqueous-developable" is meant a material in which either exposed or non-exposed areas can be preferentially removed by a developer solution which is water-based and contains less than 10% by weight of organic material. By "photoresist" is meant a photosensitive composition which can be used to form a printed circuit material, a lithographic printing plate or a proofing product. By "sludge" is meant material which accumulates in the developer solution which is insoluble in the developer solution and decreases the efficiency of the developer solution by permitting redeposition of material on the already developed substrate.

The first step in the process of the invention is: (a) applying an aqueous-developable photoresist to a surface of a first substrate, said photoresist comprising a photoinitiator; wherein the photoinitiator comprises a hexaarylbiimidazole compound having at least one hydrophilic group.

Hexaarylbiimidazoles, abbreviated as "HABI", are generally 2,4,5-triphenylimidazolyl dimers, and are well known photoinitiators. HABIs and photosensitive systems using HABIs have been disclosed in, for example, Chambers, U.S. Pat. No. 3,479,185; Chang et al., U.S. Pat. No. 3,549,367; Cescon, U.S. Pat. No. 3,684,557; Dessauer, U.S. Pat. Nos. 4,252,887 and 4,311,783; Chambers et al., U.S. Pat. No. 4,264,708; Wada et al., U.S. Pat. No. 4,410,621; Tanaka et al., U.S. Pat. No. 4,459,349; and Sheets, U.S. Pat. No. 4,622,286.

A HABI that is frequently used in photopolymerizable systems, including photoresists, is 2,2',-bis(o-chlorophenyl)-4,4',5,5'-tetraphenyl-1,1'-biimidazole, commonly known as "ortho-chloro HABI" (o-Cl-HABI).

Alternative nomenclature for o-Cl-HABI is 2,2'-bis(2-chlorophenyl)-4,4',5,5'-tetraphenyl-1,1'-bi-1H-imidazole. Surprisingly and unexpectedly, it has been found that the amount of sludge in a recycled developer solution can be significantly reduced by using a HABI which has at least one hydrophilic substituent, even though the HABI with the hydrophilic substituent is generally substantially insoluble in water.

Any hydrophilic substituent can be used as long as it does not significantly interfere with the photosensitivity of the HABI or adversely impact any other properties of the photoresist. By "hydrophilic" is meant a substituent which readily associates with water. Examples of suitable hydrophilic substituents include alkoxy groups, such as methoxy and ethoxy; hydroxy; dialkyl amino groups such as diethylamino and dipropylamino; carboxylic acid groups and their alkyl esters, amides and salts. More than one type of hydrophilic substituent can also be used. Alkoxy substituents are preferred, with methoxy being particularly preferred.

It is preferred that the HABI also have at least one chloro substituent. Without any chloro substituent the HABIs are generally less photosensitive and the resulting photoresists require longer exposure times. It is more preferred, that the HABI have at least two chloro substituents.

Examples of suitable photoinitiators include 2,2',5-tris-(o-chlorophenyl)-4-(3,4-dimethoxyphenyl)-4',5'-diphenyl-1,1'-biimidazole, abbreviated as "TCDM-HABI"; 2,2'4,4'-tetra-(o-chlorophenyl)-5,5'-bis-(3,4-dimethoxyphenyl)-1,1'-biimidazole, abbreviated as "TCTM-HABI"; 2,2'-bis-(o-chlorophenyl)-4,4',5,5'- tetra-(m-methoxyphenyl)-1,1'-biimidazole, abbreviated as "CDM-HABI"; 2,2'-bis(2-ethoxyphenyl)-4,4',5,5'-tetraphenyl-1,1'-biimidazole, abbreviated as "OE-HABI." Alternative nomenclature for TCDM-HABI is 2,2',4-tris(2-chlorophenyl)-5-(3,4-dimethoxyphenyl)-4',5'-diphenyl-1,1'-bi-1H-imidazole. Alternative nomenclature for TCTM-HABI is 2,2',5,5'-tetrakis(2-chlorophenyl)-4,4'-bis-(3,4-dimethoxyphenyl)-1,1'-bis-1H-imidazole. Mixtures of HABIs can also be used. A preferred photoinitiator is TCDM-HABI.

The HABI photoinitiators are generally prepared by oxidative coupling of triphenylimidazoles. The preparation of substituted triphenylimidazoles has been described in Cescon, U.S. Pat. No. 3,784,557, and Dessauer, U.S. Pat. No. 4,311,783. Oxidative coupling reactions have been described by Hayashi et al., in Bull. Chem. Soc. Japan 33, 565 (1960) and Zimmerman et al., Angew. Chem, 73,808 (1961). The preparation of TCDM-HABI has been described in Sheets, U.S. Pat. No. 4,622,286.

In some cases, reaction mixtures in which more than one HABI is produced can be used without complete separation and purification. As described in Sheets, U.S. Pat. No. 4,622,286, a mixture of HABIs containing TCDM-HABI can be used, in particular, an admixture of 2,4,5-triphenylimidazolyl dimers which are the product of 2-(o-chlorophenyl)-4,5-diphenylimidazole and 2,4-bis-(o-chlorophenyl)-5-[3,4-dimethoxyphenyl]-imidazole by oxidative coupling, a reaction product being 2,2',5-tris-(o-chlorophenyl)-4-(3,4-dimethoxyphenyl)-4',5'-diphenyl-1,-1'-biimidazole.

Frequently, hydrogen donor compounds are used with HABI photoinitiators in photopolymerizable systems. Suitable hydrogen donors include organic thiols, such as 2-mercaptobenzothiazole, 2-mercaptobenzoxazole, and 2-mercaptobenzimidazole; tertiary amines; N-phenylglycine; 1,1-dimethyl-3,5-diketocyclohexane; ethers; esters; alcohols; compounds containing allylic or benzylic hydrogen; acetals; aldehydes; and amides. Such materials have been discussed in MacLachlan, U.S. Pat. No. 3,390,996.

The HABI photoinitiators generally have maximum absorption in the 255–275 nm region of the spectrum with additional absorption in the 300–375 nm region. Sensitizers may be added to extend the spectral response. A sensitizer is activated by actinic radiation causing the initiator to produce free radicals. Various sensitizers have been disclosed in, for example, U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et al., U.S. Pat. No. 3,652,275, and the arylidene aryl ketones disclosed in Dueber, U.S. Pat. No. 4,162,162.

Other photoinitiators may also be present to tailor the developed image of the photoresist to that required for its particular final application. These other photoinitiators may include, but are not limited to, Michler's ketone and ethyl Michler's ketone; benzophenone; p-dialkylaminobenzaldehydes; p-dialkylaminobenzoate alkyl esters; polynuclear quinones; cyclohexadienones; benzoin and benzoin dialkyl ethers; acetophenone derivatives; thioxanthones; and others known to those skilled in the art. Mixtures may also be used.

In addition to the photoinitiator, the photoresist generally contains at least one compound which reacts with the species generated by exposure of the photoinitiator to actinic radiation, causing a change in the physical properties of the photoresist. A preferred system is a photopolymerizable system, comprising the photoinitiator, an ethylenically-unsaturated compound, and a binder. Although not limited to negative-working photopolymerizable systems, the process of the invention will be further described in terms of such systems.

The ethylenically-unsaturated compound is one which is capable of undergoing free-radical initiated polymerization and/or crosslinking. Such compounds are generally known as monomers or oligomers, although polymers having reactive pendant groups can also be used. Such compounds are well known in the art and have been disclosed in, for example, "Light-Sensitive Systems: Chemistry and Application of Nonsilver Halide Photographic Processes" by J. Kosar (John Wiley & Sons, Inc., 1965); "Imaging Processes and Materials—Neblette's Eight Edition" edited by J. Sturge, V. Walworth and A Shepp (Van Nostrand Reinhold, 1989); and "Photoreactive Polymer—The Science and Technology of Resists" by A. Reiser (John Wiley & Sons, 1989). Typical monomers are: unsaturated esters of alcohols, preferably ester of polyols with acrylic or methacrylic acid, such as t-butyl acrylate, cyclohexyl acrylate, hydroxy-C1–C10-alkyl acrylate, butanediol diacrylate, hexamethylene glycol diacrylate, trimethylolpropane triacrylate, polyoxyethylated trimethylopropane triacrylate, diethylene glycol diacrylate, glycerol triacrylate, ethylene glycol dimethacrylate, pentaaerythritol tri- and tetraacrylate and methacrylate; acryloxy- and methacryloxy-alkyl ethers of bisphenol A, such as di-(3-acryloxy-2-hydroxypropyl)ether of bisphenol A and di-(3-acryloxy-2-hydroxypropyl)ether of tetrabromo-bisphenol A; unsaturated amides, such as 1,6-hexamethylene bis-acrylamide; vinyl esters, such as divinyl succinate, divinyl phthalate, and divinyl benzene-1,3-disulfonate; styrene and derivatives thereof; and N-vinyl compounds, such as N-vinyl carbazole.

The binder is a film forming material which may contain reactive groups. For aqueous processability, the binders should be developable by aqueous alkaline solution. By "developable" is meant that the binders are soluble, swellable or dispersible in the developer solution. Preferably, the binder is soluble in the developer solution. Particularly preferred as binders are acidic, polymeric, organic compounds. Single or multiple binder compounds can be used. One class of binders which is useful in the process of the invention is vinyl addition polymers containing free carboxylic acid groups. These are prepared from 30–94 mole percent of one or more alkyl acrylates and 70–6 mole percent of one or more alpha-beta ethylenically unsaturated carboxylic acids; more preferably from 61–94 mole percent of two alkyl acrylates and 39–6 mole percent of an alpha-beta ethylenically unsaturated carboxylic acid. Suitable alkyl acrylates for use in preparing these polymeric binders include methyl acrylate, ethyl acrylate, propyl acrylate, butyl acrylate, and the methacrylate analogs. Suitable alpha-beta ethylenically unsaturated carboxylic acids include acrylic acid, methacrylic acid, crotonic acid, maleic acid or maleic anhydride, and the like. Binders of this type, including their preparation, are described in German Application, OS 2,320,849, published Nov. 8, 1973. Also suitable are copolymers of styrene and substituted styrenes with an unsaturated carboxyl-containing monomer, as described in detail in British Patent 1,361,298.

Other components conventionally added to photopolymerizable compositions can be present to modify the physical properties of the film. Such components include: plasticizers, thermal stabilizers, optical brighteners, ultraviolet radiation absorbing material, color formers, adhesion modifiers, coating aids, and release agents. In addition, depending on the application, other inert additives can be employed such as dyes, pigments and fillers. These additives are generally present in minor amounts so as not to interfere with the exposure of the photoresist.

Typical compositions for the photopolymerizable photoresist are, by weight: photoinitiator(s), 0.1 to 10%, preferably 1 to 5%; ethylenically unsaturated compound(s), 5 to 60%, preferably 15 to 50%; binder(s), 25 to 90%, preferably 45 to 75%; all other components, 0 to 5%, preferably 0 to 4%.

A wide variety of substrates can be used in the process of the invention. By "substrate" is meant any natural or synthetic support, preferably one which is capable of existing in a flexible or rigid form. For example, the substrate can be a metal sheet or foil, a sheet or film of synthetic organic resin, cellulose paper, fiberboard, and the like, or a composite of two or more of these materials.

The particular substrate will generally be determined by the intended application. For example, when printed circuits are produced, the substrate may be a copper coated fiberglass epoxy board, copper clad film, or printed circuit relief pattern on the board or film. For lithographic printing plates, the substrate may be anodized aluminum. For proofing applications, the substrate may be polyester film or polyester-coated paper.

The photoresist composition may be applied to the substrate by coating from a suitable solvent, such as dichloromethane, methanol, or acetone. Any conventional coating technique can be used. Alternatively, the photoresist composition can be coated or extruded onto a polymer film support, such as polyethylene terephthalate film support, and dried to form a film. This can then be laminated to the substrate, again using conventional techniques. The support film acts as a coversheet which is removed after exposure. The photoresist film may be protected until it is ready for use by a release film, such as polyethylene or polypropylene, which is removed prior to lamination to the support.

The final dry thickness of the photoresist on the substrate will depend on the intended application. The thickness is generally in the range of 0.2 to 4 mil (5 to 100 microns), preferably 0.5 to 2 mil (13 to 50 microns).

The second step in the process of the invention is: (b) imagewise exposing to actinic radiation to produce exposed and non-exposed areas in the photoresist.

Any convenient source or sources of actinic radiation providing wavelengths in the region of the spectrum that overlap the absorption bands of the photoinitiator and/or sensitizer can be used to activate the photoreactions. By "actinic radiation" is meant radiation which is active to cause the photoinitiator to initiate the reactions which change the physical properties of the photoresist. For photopolymerizable systems, actinic radiation causes the productions of the free-radicals necessary to initiate free-radical polymerization of the ethylenically-unsaturated compound (s). The radiation can be natural or artificial, monochromatic or polychromatic, incoherent or coherent, and for high efficiency should correspond closely to in wavelength to the absorption of the initiator system. Conventional light sources include fluorescent lamps, mercury, metal additive and arc lamps. Coherent light sources are xenon, argon ion and ionized neon laser, as well as tunable dye laser and the frequency double neodymium:YAG laser, whose emissions fall within or overlap the visible absorption bands of the sensitizer.

The third step in the process of the invention is: (c) treating the imagewise-exposed photoresist with a sample of aqueous alkaline solution to remove either the exposed or the non-exposed areas of the photoresist. In photopolymerizable systems, the non-exposed areas are removed.

The developer solution is generally a solution of from 0.01 to 2% by weight of a water-soluble base in water. Suitable bases include the alkali metal hydroxides, such as lithium, sodium and potassium hydroxide; the base-reacting alkali metal salts of weak acids, such as lithium, sodium and potassium carbonates and bicarbonates; ammonium hydroxide and tetra-substituted ammonium hydroxides, such as tetramethyl and tetraphenyl ammonium hydroxide; sulfonium salts including the hydroxides, carbonates, bicarbonates, and sulfides; alkali metal phosphates and pyrophosphates, such as sodium and potassium triphosphates and pyrophosphates; tetra-substituted phosphonium arsonium and stibonium hydroxides, such as tetramethylphosphonium hydroxide. The developer compositions may also contain surfactants. However, the total organic content should be less than 10% by weight, preferably less than 5% by weight. A preferred developer is a 1% by weight solution of sodium carbonate.

The development step can be carried out as a batch or a continuous process using any conventional technique, such as dipping or spraying. The aqueous developer solution can be at room temperature or heated to up to about 80° C. Many commercial processors are available for development.

The next steps in the process of the invention are to repeat the first three steps with a new substrate and photoresist sample, but using essentially the same developer sample. In other words, the developer is recycled and used again to develop more photoresist. As more and more photoresist is developed by the sample of developer solution, even in the absence of sludge formation, the developer becomes less effective as it becomes more saturated with dissolved photoresist. Ultimately, even in the absence of sludge formation, the developer solution must be replenished, in which a large volume of fresh solution is added to used solution, or replaced entirely with fresh developer. In some development processes, a small portion of the developer solution is removed and an equal amount of fresh developer added after each sample of photoresist is processed. These systems are known in the industry as "feed and bleed" systems. In general, a physical property, such as pH, conductivity or UV absorbance, is continuously monitored. When this property falls outside a predetermined limit, a small amount of developer is removed and fresh developer is added to adjust the property to the desired set point. Since only a small amount of developer is removed and replaced in each cycle, the developing solution sample is essentially the same each time. By "essentially the same" is meant that less than 20% by volume of the original sample of developer has been replaced with fresh developer in any one developing cycle.

Typically, developer solution is recycled until up to about 8–10 square feet (0.74 to 0.92 square meters) of photoresist having a thickness of 1 mil (25 microns) is developed per one gallon (3.8 liters) of developer solution. A maximum of 50 square feet (4.6 square meters) can be developed in some instances, but this is rarely achieved. In general, this results in a loading of about 30–50 g of photoresist developed by 1 liter of developer before the developer is replenished or replaced. The formation of excess sludge in the developer solution can drastically diminish the amount of photoresist that can be developed before replenishing or replacing the developer. In the process of the invention, the amount of sludge formation is reduced to a level such that in a standard test, treatment of 3 g of unexposed photoresist with 100 g developer solution produces less than 0.05 g of precipitate. Preferably less than 0.01 g precipitate is produced.

While the photosensitive compositions of the invention result in lower sludge formation in development, it is important that the other properties of the photoresist not be adversely affected. In particular, the photospeed must not be significantly reduced.

In some cases, when the photoresist is used in the formation of a printed circuit material, the processed portion of the photoresist remains as a permanent part of the circuit structure. By "processed" is meant that portion of the photoresist that remains on the substrate alter the exposure and development steps. In positive-working systems, the processed photoresist represents the unexposed areas of the photoresist. In negative-working systems, the processed photoresist represents the exposed areas of the photoresist. However, in other cases, after the processed photoresist has served its purpose in, for example, plating and/or etching steps, the processed photoresist is removed in a stripping step. A second embodiment of the present invention, is a process for the removal of processed photoresist resulting in lower sludge formation.

In the second embodiment, the processed photoresist is removed from a substrate by:
  (a) treating the processed photoresist with a sample of a stripper solution, resulting in removal of the processed photoresist; and
  (b) repeating step (a) at least 5 times, wherein each repetition uses a new substrate and processed photoresist and essentially the same sample of stripper solution;
wherein the photoresist comprises at least one hexaarylbiimidazole compound having at least one hydrophilic group, and wherein treatment of 3 grams of processed photoresist with 100 grams of the stripper solution produces less than 0.05 grams precipitate.

The composition of the photoresist, the hexaarylbiimidazole photoinitiator, and the substrate are the same as described above. The photoresist is exposed to actinic radiation and developed as described above.

The stripper compositions generally must be strong enough to removed the processed photoresist without damaging the substrate or any components on the substrate. Stripper compositions are well known in the art and can be found in, for example, "Printed Circuits Handbook" edited by C. F. Coombs, Second Edition (McGraw-Hill, Inc., 1979) and "Photoresist—Materials and Processes" by W. S. DeForest (McGraw-Hill, Inc., 1975).

For positive-working systems, in which the unexposed areas of the photoresist are removed in the stripping step, the stripper is generally the same as or similar to the solvent solution which was used to coat the photoresist onto a film or the substrate. Examples of suitable solvents include methylene chloride, acetone, alcohols, and glycol ethers. Mixtures of solvents may also be used.

For negative-working systems, in which the exposed photoresist is removed in the stripping step, the strippers are generally more severe. The strippers for aqueous-developable photoresists are generally caustic solutions, such as solutions of potassium or sodium hydroxide; aqueous solutions of choline and derivatives; aqueous solutions of organic amines. The strippers may include other components to increase the stripping power, such as chlorinated phenols or cresols; or chelating agents. Other additives, such as surfactants or anti-foaming agents may also be present. Preferred stripper solutions are aqueous alkalines solutions. Particularly preferred are solutions of sodium hydroxide and solutions of potassium hydroxide.

The stripping step can be carried out as a batch or a continuous process using any conventional technique, such as dipping or spraying. The stripping solution can be at room temperature, but generally is heated to up to about 120–150° F. (50–65° C.), preferably 120–130° F. (50–55° C.). Many commercial processors are available for stripping.

The next steps in the process of the invention are to repeat the stripping step with a new substrate and processed photoresist sample, but using essentially the same stripper sample. In other words, the stripper is recycled and used again to remove more processed photoresist. As more and more photoresist is removed by the sample of stripper solution, even in the absence of sludge formation, the stripper becomes less effective as it becomes more saturated with dissolved photoresist. Ultimately, even in the absence of sludge formation, the stripper solution must be replenished, in which a large volume of fresh solution is added to used solution, or replaced entirely with fresh stripper. As with the development, some stripping processes use a feed and bleed system. By "essentially the same" is meant that less than 20% by volume of the original sample of stripper has been replaced with fresh stripper in each stripping cycle.

The amount of photoresist that can be removed by a stripper varies considerably with the type of photoresist and the type stripper and equipment used. The formation of excess sludge in the stripper solution can drastically diminish the amount of photoresist that can be stripped before replenishing or replacing the stripper. In the process of the invention, the amount of sludge formation is reduced to a level such that in a standard test, treatment of 3 g of processed photoresist with 100 g stripper solution produces less than 0.05 g of precipitate. Preferably less than 0.01 g precipitate is produced.

EXAMPLES

The invention is illustrated by the following examples which are not intended to be limiting. All percentages are by weight, unless otherwise indicated.

Glossary

| Abbreviation | Chemical Name | CAS # |
|---|---|---|
| BP | Benzophenone | 119-61-9 |
| CBT | 50:50 mixture, 4- and 5-carboxybenzotriazole | 60932-58-3 |
| 5-Cl-BT | 5-Chlorobenzotriazole | 94-97-3 |
| CD-541 | Ethoxylated bisphenol A dimethacrylate (6 moles ethylene oxide) | 41637-38-1 |
| CM-HABI | 2,2'-bis(2-carbomethoxy-phenyl)-4,4',5,5'-tetraphenyl-1,1'-biimidazole | |
| DBC | 2,3-Dibromo-3-phenylpropiophenone | 611-91-6 |
| DEHA | N,N-Diethylhydroxylamine | 3710-84-7 |
| E-2627 | Poly(methyl methacrylate/ethyl acrylate/methacrylic acid (50/30/20) | 25133-97-5 |
| EDAB | Ethyl-p-dimethylaminobenzoate | 10287-53-3 |
| EMK | Ethyl Michler's ketone | 90-93-7 |
| ITX | Isopropylthioxanthone | 5495-84-1 |
| LCV | Leuco crystal violet | 603-48-5 |
| MEK | Methyl ethyl ketone | |
| nPG | n-Phenyl glycine | 103-01-5 |
| NK Ester 9PG | Propylene glycol 400 dimethacrylate (7 moles propylene oxide) | 25852-49-7 |
| o-Cl-HABI | 2,2'-bis(2-chlorophenyl)-4,4',5,5'-tetraphenyl-1,1'-bi-1H-imidazole | 124354-60-5 |
| ODAB | 2-Ethylhexyl-4-(dimethylamino) benzoate | 21245-02-3 |
| OE-HABI | 2,2'-bis(2-ethoxyphenyl)-4,4',5,5'-tetraphenyl-1,1'-biimidazole | |
| P-31R | 31/1 Block copolymer of propylene oxide and ethylene oxide | 9003-11-6 |
| S-661 | Poly(monoisobutyl maleate/styrene) (42/58) | 28571-95-1 |
| SR604 | Propylene glycol mono-methacrylate (5 moles propylene oxide) | 39420-45-6 |
| SR9036 | Ethoxylated bisphenol A dimethacrylate (30 moles ethylene oxide) | 41637-38-1 |
| TCDM-HABI | 2,2',4-tris(2-chlorophenyl)-5-(3,4-dimethoxyphenyl)-4',5'-diphenyl-1,1'-bi-1H-imidazole | 100486-97-3 |
| TCTM-HABI | 2,2',5,5'-tetrakis(2-chloro-phenyl)-4,4'-bis(3,4-dimethoxyphenyl)-1,1'-bis-1H-imidazole | 71002-23-8 |
| TMCH | 4-Methyl-4-trichloromethyl-2,4-cyclohexadienone | |
| VGD | Victoria Green dye | 569-64-2 |
| XPD-2470 | Copolymer of n-butyl acrylate/ethyl acrylate/methyl methacrylate/methacrylic acid (20/13/42/25) | |

All films were prepared by dissolving the components in the solvent indicated and coating onto 0.75 mil (19 micron) polyester film using a 10 mil (254 micron) doctor blade. The coatings were air dried at 25° C. to give a dry photoresist film layer with a thickness of 1.2 mils (30.5 microns).

Sludge Test

To determine sludge formation a sludge test was developed. A developer solution was prepared by dissolving 20 g sodium carbonate in 2 liters of water and adding 1.5 ml of Pluronic\31R1 (BASF, Mt. Olive, N.J.), which is a polyoxyethylene/polyoxypropylene copolymer plasticizer. A 12 inch by 12 inch (30.5×30.5 cm) sample of unexposed photoresist film that was 1.2 mil (30.5 micron) thick, representing 3.4 g of photoresist, was placed in 100 g of the developer solution. The sample was allowed to sit until the photoresist sample had dissolved, and the amount of precipitate was determined according to the following scale:

0=no yellowish precipitate

1=slight amount of finely divided yellowish material

5=moderate amount of yellowish material, usually more finely divided

10=heavy, solid layer of yellowish material on bottom; material is usually flaky Measurements have shown that the ratings represent the following amounts of precipitate:

0: $\mu$ 0.005 g

1: 0.005 to 0.01 g

5: 0.05 to 0.08 g

10: Ï 0.1 g

Photospeed A photopolymer film/copper laminate was prepared in order to determine development time and test for photospeed. The 1.2 mil (30.5 micron) photoresist films were laminated to 1 oz. (28 g) brush scrubbed copper FR-4 laminate, using a hot roll laminator at 1.5 m/min and a roll temperature of 105° C.

The development time was measured as the time required to completely remove the photopolymer from the copper laminate using 1.5% sodium carbonate aqueous solution at 85° C. in a Chemcut CS2000 developer with a spray pressure of 28 psi.

The photospeed was measured using a 41 step Stouffer density tablet. The film was exposed with 10 to 80 mJ/cm$^2$, using a DuPont PC-530 exposure unit (E.I. du Pont de Nemours and Company, Wilmington, Del.), and using a total time in the developer chamber of 1.5 times the minimum development time. The last step in which at least 50% of the photopolymer remained was determined. This step, identified as the "step held," was reported as the photospeed. For a commercial product, a photospeed of at least 15 steps held at an exposure of 10 mJ/cm$^2$ and at least 28 steps held at an exposure of 40 mJ/cm$^2$ is desirable. For every 5 steps lowered, the photospeed is decreased by 50%.

Example 1

This example illustrates the use of different photoinitiator systems. Examples 1-1, 1-2 and 1-3 represent the invention using TCDM-HABI with and without benzophenone. Comparative examples C-1A through C-1C illustrate compositions using o-Cl-HABI, with and without benzophenone. Comparative examples C-1D through C-1F illustrate compositions having no HABI photoinitiators.

Photosensitive solutions were prepared having the following compositions:

| Component | SAMPLE, parts by weight | | | | | |
|---|---|---|---|---|---|---|
| | 1-1 | 1-2 | 1-3 | C-1A | C-1B | C-1C |
| XPD-2470 | 65.7 | 65.7 | 65.7 | 65.7 | 65.7 | 65.7 |
| TMPEOTA | 12 | 12 | 12 | 12 | 12 | 12 |
| SR9036 | 9 | 9 | 9 | 9 | 9 | 9 |
| NK Ester 9PG | 6.4 | 6.4 | 6.4 | 6.4 | 6.4 | 6.4 |
| SR604 | 3 | 3 | 3 | 3 | 3 | 3 |

-continued

| | | | | | | |
|---|---|---|---|---|---|---|
| o-Cl-HABI | — | — | — | 3 | 1 | 0.9 |
| TCDM-HABI | 0.5 | 1 | 0.5 | — | — | — |
| EMK | 0.06 | 0.06 | 0.15 | 0.06 | 0.06 | — |
| ITX | 0.4 | 0.4 | — | 0.4 | 0.4 | — |
| nPG | 0.5 | 0.5 | — | 0.5 | 0.8 | — |
| TMCH | — | — | — | — | — | 0.25 |
| ODAB | — | — | — | — | — | — |
| EDAB | — | — | — | — | — | — |
| BP | — | — | 2 | — | — | 5 |
| LCV | 0.3 | 0.3 | 0.35 | 0.3 | 0.3 | 0.25 |
| VGD | 0.04 | 0.04 | 0.04 | 0.04 | 0.04 | 0.04 |
| DBC | — | — | 0.25 | — | — | — |
| CBT | 0.02 | 0.02 | 0.02 | 0.02 | 0.02 | 0.02 |
| 5-Cl-BT | 0.01 | 0.01 | 0.01 | 0.01 | 0.01 | 0.01 |
| DEHA | 0.02 | 0.02 | 0.02 | 0.02 | 0.02 | 0.02 |
| TOTAL | 97.5 | 98 | 99.49 | 100 | 98.03 | 102.59 |

| | SAMPLE, parts by wt | | |
|---|---|---|---|
| Component | C-1D | C-1E | C-1F |
| XPD-2470 | 65.7 | 65.7 | 65.7 |
| TMPEOTA | 12 | 12 | 12 |
| SR9036 | 9 | 9 | 9 |
| NK Ester 9PG | 6.4 | 6.4 | 6.4 |
| SR604 | 3 | 3 | 3 |
| o-Cl-HABI | — | — | — |
| TCDM-HABI | — | — | — |
| EMK | 0.14 | 0.14 | 0.16 |
| ITX | — | 0.5 | — |
| nPG | — | 0.5 | — |
| TMCH | — | — | — |
| ODAB | 2 | — | — |
| EDAB | — | — | 1.7 |
| BP | 5 | 3 | 4 |
| LCV | 0.35 | 0.35 | 0.35 |
| VGD | 0.04 | 0.04 | 0.04 |
| DBC | 0.15 | 0.15 | — |
| CBT | 0.02 | 0.02 | 0.02 |
| 5-Cl-BT | 0.01 | 0.01 | 0.01 |
| DEHA | 0.02 | 0.02 | 0.02 |
| TOTAL | 104.8 | 100.13 | 102.4 |

Solutions of 50% solids in acetone were coated to form films. The films were tested for sludge formation and photospeed. The results are given in the table below.

| | SAMPLE | | | | | |
|---|---|---|---|---|---|---|
| | 1-1 | 1-2 | 1-3 | C-1A | C-1B | C-1C |
| Sludge | 0 | 2 | 0 | 10 | 3 | 2 |
| Photospeed | | | | | | |
| 10 mJ/cm$^2$ | 11 | 16 | 12 | 15 | 10 | 9 |
| 20 mJ/cm$^2$ | 16 | 21 | 18 | 21 | 16 | 16 |
| 40 mJ/cm$^2$ | 23 | 28 | 25 | 28 | 23 | 23 |
| 80 mJ/cm$^2$ | 29 | 34 | 32 | 34 | 29 | 29 |

| | SAMPLE | | |
|---|---|---|---|
| | C-1D | C-1E | C-1F |
| Sludge | 0 | 0 | 0 |
| Photospeed | | | |
| 10 mJ/cm$^2$ | 10 | 4 | 9 |
| 20 mJ/cm$^2$ | 16 | 10 | 15 |
| 40 mJ/cm$^2$ | 24 | 18 | 23 |
| 80 mJ/cm$^2$ | 30 | 24 | 29 |

It is clear from the above data that at levels where the photospeed is acceptable, there is much more sludge formation in the compositions with o-Cl-HABI. Compositions with the ODAB, EDAB and BP photoinitiators, while not having significant sludge, have very slow photospeed.

Example 2

This example illustrates the use of different photoinitiator systems with different binders. Examples 2-1, 2-2 and 2-3 represent the invention using TCDM-HABI. Comparative examples C-2A through C-2C illustrate compositions using o-Cl-HABI.

Photosensitive solutions were prepared having the following compositions:

| | SAMPLE, parts by weight | | | | | |
|---|---|---|---|---|---|---|
| Component | 2-1 | 2-2 | 2-3 | C-2A | C-2B | C-2C |
| XPD-2470 | 65.7 | — | — | 65.7 | — | — |
| S-661 | — | 65.7 | — | — | 65.7 | — |
| E-2627 | — | — | 65.7 | — | — | 65.7 |
| TMPEOTA | 12 | 12 | 12 | 12 | 12 | 12 |
| SR9036 | 9 | 9 | 9 | 9 | 9 | 9 |
| NK Ester 9PG | 6.4 | 6.4 | 6.4 | 6.4 | 6.4 | 6.4 |
| SR604 | 3 | 3 | 3 | 3 | 3 | 3 |
| o-Cl-HABI | — | — | — | 3 | 3 | 3 |
| TCDM-HABI | 1.5 | 1.5 | 1.5 | — | — | — |
| EMK | 0.06 | 0.06 | 0.15 | 0.06 | 0.06 | 0.06 |
| ITX | 0.4 | 0.4 | 0.4 | 0.4 | 0.4 | 0.4 |
| nPG | 0.5 | 0.5 | 0.5 | 0.5 | 0.5 | 0.5 |
| LCV | 0.3 | 0.3 | 0.3 | 0.3 | 0.3 | 0.3 |
| VGD | 0.04 | 0.04 | 0.04 | 0.04 | 0.04 | 0.04 |
| TOTAL | 99.95 | 98.45 | 99.95 | 98.45 | 99.95 | 98.45 |

Solutions of 50% solids in acetone were coated to form films. The films were tested for sludge formation, with the results given in the table below.

| | SAMPLE | | | | | |
|---|---|---|---|---|---|---|
| | 2-1 | 2-2 | 2-3 | C-2A | C-2B | C-2C |
| Sludge | 0 | 4 | 2 | 10 | 3 | 10 |

Again, there is significantly less sludge formation with compositions containing TCDM-HABI. Note that the levels of o-Cl-HABI and TCDM-HABI were chosen such that coatings of commercially viable photospeeds were obtained. The TCDM-HABI coatings, in fact, had photospeeds approximately 25% faster than those with o-Cl-HABI.

Example 3

This example illustrates the use of different photoinitiator systems with a different monomer. Example 3-1 represents the invention using TCDM-HABI. Comparative example C-3A illustrates a composition using o-Cl-HABI.

Photosensitive solutions were prepared having the following compositions:

| Component | SAMPLE, parts by weight | |
|---|---|---|
| | 3-1 | C-3A |
| XPD-2470 | 65.7 | 65.7 |
| TMPEOTA | 18 | 18 |
| NK Ester 9PG | 6 | 6 |
| CD541 | 6 | 6 |
| o-Cl-HABI | — | 3 |
| TCDM-HABI | 0.25 | — |
| EMK | 0.12 | 0.06 |
| ITX | 0 | 0.4 |
| nPG | 0 | 0.5 |
| TMCH | 0.3 | — |
| EDAB | 2 | — |
| BP | 4 | — |
| LCV | 0.4 | 0.3 |
| VGD | 0.04 | 0.04 |
| DBC | 0.15 | — |
| CBT | 0.02 | 0.02 |
| 5-Cl-BT | 0.01 | 0.01 |
| DEHA | 0.02 | 0.02 |
| P-31R1 | 2.44 | — |
| TOTAL | 106.02 | 99.17 |

Solutions of 50% solids in acetone were coated to form films. The films were tested for sludge formation and photospeed. The results are given in the table below.

| | SAMPLE | |
|---|---|---|
| | 3-1 | C-3A |
| Sludge | 0 | 3 |
| Photospeed | | |
| 10 mJ/cm$^2$ | 14 | 18 |
| 20 mJ/cm$^2$ | 20 | 24 |
| 40 mJ/cm$^2$ | 26 | 30 |

Although this photosensitive composition in general results in less sludge, clearly the TCDM-HABI composition results in less sludge than the o-Cl-HABI composition. The photospeed of the TCDM-HABI composition could be improved by increasing the HABI concentration slightly, since it is at a very low level.

Example 4

This example illustrates the effect of different levels of HABI photoinitiators on sludge formation. Examples 4-1 through 4-3 illustrate compositions of the invention using TCDM-HABI. Comparative examples C-4A through C-4E illustrate compositions using o-Cl-HABI.

Photosensitive solutions were prepared having the following compositions:

| Component | SAMPLE, parts by weight | | | | | |
|---|---|---|---|---|---|---|
| | 4-1 | 4-2 | 4-3 | C-4A | C-4B | C-4C |
| XPD-2470 | 65.7 | 65.7 | 65.7 | 65.7 | 65.7 | 65.7 |
| TMPEOTA | 12 | 12 | 12 | 12 | 12 | 12 |
| SR9036 | 9 | 9 | 9 | 9 | 9 | 9 |
| NK Ester 9PG | 6.4 | 6.4 | 6.4 | 6.4 | 6.4 | 6.4 |
| SR604 | 3 | 3 | 3 | 3 | 3 | 3 |
| o-Cl-HABI | — | — | — | 3 | 1 | 0.5 |
| TCDM-HABI | 3 | 1 | 0.5 | — | — | — |
| EMK | 0.06 | 0.06 | 0.06 | 0.06 | 0.06 | 0.06 |
| ITX | 0.4 | 0.4 | 0.4 | 0.4 | 0.4 | 0.4 |
| nPG | 0.5 | 0.5 | 0.5 | 0.5 | 0.5 | 0.5 |
| LCV | 0.3 | 0.3 | 0.3 | 0.3 | 0.3 | 0.3 |
| VGD | 0.04 | 0.04 | 0.04 | 0.04 | 0.04 | 0.04 |
| TOTAL | 99.95 | 97.95 | 97.45 | 99.95 | 97.95 | 97.45 |

| Component | SAMPLE, parts by weight | |
|---|---|---|
| | C-4D | C-4E |
| XPD-2470 | 65.7 | 65.7 |
| TMPEOTA | 18 | 30.4 |
| SR9036 | 3 | — |
| NK Ester 9PG | 6.4 | — |
| SR604 | 3 | — |
| o-Cl-HABI | 3 | 3 |
| TCDM-HABI | — | — |
| EMK | 0.06 | 0.06 |
| ITX | 0.4 | 0.4 |
| nPG | 0.5 | 0.5 |
| LCV | 0.3 | 0.3 |
| VGD | 0.04 | 0.04 |
| TOTAL | 99.95 | 99.95 |

Solutions of 50% solids in acetone were coated to form films. The films were tested for sludge formation, with the results given in the table below. In addition to the visual sludge rating, the samples were centrifuged and the solids collected. The weight of the dried sludge, in grams, was determined.

| | SAMPLE | | | | | |
|---|---|---|---|---|---|---|
| | 4-1 | 4-2 | 4-3 | C-4A | C-4B | C-4C |
| Sludge | | | | | | |
| rating | 3 | 0 | 0 | 10 | 6 | 1 |
| weight (g) | 0.029 | 0.004 | 0.005 | 0.141 | 0.068 | 0.047 |

| | SAMPLE | |
|---|---|---|
| | C-4D | C4B |
| Sludge | | |
| rating | 5 | 9 |
| weight(g) | 0.054 | 0.082 |

It is clear from the above data that higher amounts of TCDM-HABI can be used with lower sludge formation. The photospeeds of the above coatings are such that sample 4-2 is comparable in photospeed to comparative sample C-4A. At the level of o-Cl-HABI in comparative sample C-4B, a coating with a commercially non-viable photospeed is obtained. Even at this level, the quantity of sludge is still significantly higher than that obtained with sample 4-2.

Example 5

This example illustrates the use of other HABI photoinitiators of the invention. Examples 5-1 and 5-2 represent the invention using TCDM-HABI. Examples 5-3 and 5-4 represent the invention using TCTM-HABI. Examples 5-5 and 5-6 represent the invention using carbomethoxy HABI (CM-HABI). Comparative examples C-5A and C-5B illustrate compositions using o-Cl-HABI.

Photosensitive solutions were prepared having the following compositions:

| | SAMPLE, parts by weight | | | | | |
|---|---|---|---|---|---|---|
| Component | 5-1 | 5-2 | 5-3 | 5-4 | 5-5 | 5-6 |
| XPD-2470 | 65.7 | 65.7 | 65.7 | 65.7 | 65.7 | 65.7 |
| TMPEOTA | 12 | 12 | 12 | 12 | 12 | 12 |
| SR9036 | 9 | 9 | 9 | 9 | 9 | 9 |
| NK Ester 9PG | 6.4 | 6.4 | 6.4 | 6.4 | 6.4 | 6.4 |
| SR604 | 3 | 3 | 3 | 3 | 3 | 3 |
| EMK | 0.06 | 0.06 | 0.06 | 0.06 | 0.06 | 0.06 |
| TCDM-HABI | 1 | 0.75 | — | — | — | — |
| TCTM-HABI | — | — | 1 | 0.75 | — | — |
| CM-HABI | — | — | — | — | 1 | 0.75 |
| ITX | 0.4 | 0.4 | 0.4 | 0.4 | 0.4 | 0.4 |
| nPG | 0.5 | 0.5 | 0.5 | 0.5 | 0.5 | 0.5 |
| LCV | 0.3 | 0.3 | 0.35 | 0.3 | 0.3 | 0.3 |
| VGD | 0.04 | 0.04 | 0.04 | 0.04 | 0.04 | 0.04 |
| CBT | 0.02 | 0.02 | 0.02 | 0.02 | 0.02 | 0.02 |
| 5-Cl-BT | 0.01 | 0.01 | 0.01 | 0.01 | 0.01 | 0.01 |
| DEHA | 0.02 | 0.02 | 0.02 | 0.02 | 0.02 | 0.02 |
| TOTAL | 99 | 98.88 | 99 | 98.88 | 100 | 99 |

| | SAMPLE, parts by weight | |
|---|---|---|
| Component | C-5A | C-5B |
| XPD-2470 | 65.7 | 65.7 |
| TMPEOTA | 12 | 12 |
| SR9036 | 9 | 9 |
| NK Ester 9PG | 6.4 | 6.4 |
| SR604 | 3 | 3 |
| EMK | 0.06 | 0.06 |
| o-Cl-HABI | 3 | 1 |
| ITX | 0.4 | 0.4 |
| nPG | 0.5 | 0.5 |
| LCV | 0.3 | 0.3 |
| VGD | 0.04 | 0.04 |
| CBT | 0.02 | 0.02 |
| o-Cl-BT | 0.01 | 0.01 |
| DEHA | 0.02 | 0.02 |
| TOTAL | 100 | 99 |

Solutions of 50% solids in acetone were coated to form films. The films were tested for sludge formation and photospeed. The results are given in the table below.

| | SAMPLE | | | | | |
|---|---|---|---|---|---|---|
| | 5-1 | 5-2 | 5-3 | 5-4 | 5-5 | 5-6 |
| Sludge | 1 | 1 | NA | 1 | 1 | 1 |
| Photospeed | | | | | | |
| 20 mJ/cm$^2$ | 19 | 17 | 18 | 16 | 14 | 8 |
| 40 mJ/cm$^2$ | 25 | 23 | 24 | 23 | 20 | 14 |
| 80 mJ/cm$^2$ | 31 | 29 | 30 | 29 | 26 | 20 |

| | SAMPLE | |
|---|---|---|
| | C-5A | C-5B |
| Sludge | 7 | 3 |
| Photospeed | | |
| 20 mJ/cm$^2$ | 20 | 11 |
| 40 mJ/cm$^2$ | 26 | 17 |
| 80 mJ/cm$^2$ | 30 | 24 |

It is clear from the above data that at levels where the photospeed is acceptable, there is much more sludge formation in the compositions with o-Cl-HABI.

Example 6

This example illustrates the use of other HABI photoinitiators of the invention. Examples 6-1 through 6-4 illustrate the invention using TCDM-HABI. Examples 6-5 through 6-8 illustrate the invention using o-ethoxy-HABI (OE-HABI). Comparative examples C-6A through C-6D illustrate compositions using o-Cl-HABI.

Photosensitive solutions were prepared having the following compositions:

| | SAMPLE, parts by weight | | | | | |
|---|---|---|---|---|---|---|
| Component | 6-1 | 6-2 | 6-3 | 6-4 | 6-5 | 6-6 |
| XPD-2470 | 66.95 | 66.95 | 66.95 | 66.95 | 65.7 | 65.7 |
| TMPEOTA | 13 | 19 | 19 | 31.4 | 12 | 18 |
| SR9036 | 9 | 6 | — | — | 9 | 6 |
| NK Ester 9PG | 6.4 | 6.4 | 6 | — | 6.4 | 6.4 |
| SR604 | 3 | — | 4 | — | 3 | — |
| CD-541 | — | — | 6 | — | — | — |
| EMK | 0.06 | 0.06 | 0.06 | 0.06 | 0.06 | 0.06 |
| TCDM-HABI | 0.75 | 0.75 | 0.75 | 0.75 | — | — |
| OE-HABI | — | — | — | — | 3 | 3 |
| ITX | 0.4 | 0.4 | 0.4 | 0.4 | 0.4 | 0.4 |
| nPG | 0.5 | 0.5 | 0.5 | 0.5 | 0.5 | 0.5 |
| LCV | 0.3 | 0.3 | 0.35 | 0.3 | 0.3 | 0.3 |
| VGD | 0.04 | 0.04 | 0.04 | 0.04 | 0.04 | 0.04 |
| CBT | 0.02 | 0.02 | 0.02 | 0.02 | 0.02 | 0.02 |
| 5-Cl-BT | 0.01 | 0.01 | 0.01 | 0.01 | 0.01 | 0.01 |
| DEHA | 0.02 | 0.02 | 0.02 | 0.02 | 0.02 | 0.02 |
| TOTAL | 100 | 100 | 100 | 100 | 100 | 100 |

| | SAMPLE, parts by weight | | | | | |
|---|---|---|---|---|---|---|
| Component | 6-7 | 6-8 | C-6A | C-6B | C-6C | C-6D |
| XPD-2470 | 65.7 | 65.7 | 65.7 | 65.7 | 65.7 | 65.7 |
| TMPEOTA | 18 | 30.4 | 12 | 18 | 18 | 30.4 |
| SR9036 | — | — | 9 | 6 | — | — |
| NK Ester 9PG | 6.4 | — | 6.4 | 6.4 | 6.4 | — |
| SR604 | — | — | 3 | — | — | — |
| CD-541 | 6 | — | — | — | 6 | — |
| EMK | 0.06 | 0.06 | 0.06 | 0.06 | 0.06 | 0.06 |
| OE-HABI | 3 | 3 | — | — | — | — |
| o-Cl-HABI | — | — | 3 | 3 | 3 | 3 |
| ITX | 0.4 | 0.4 | 0.4 | 0.4 | 0.4 | 0.4 |
| nPG | 0.5 | 0.5 | 0.5 | 0.5 | 0.5 | 0.5 |
| LCV | 0.3 | 0.3 | 0.35 | 0.3 | 0.3 | 0.3 |
| VGD | 0.04 | 0.04 | 0.04 | 0.04 | 0.04 | 0.04 |
| CBT | 0.02 | 0.02 | 0.02 | 0.02 | 0.02 | 0.02 |
| 5-Cl-BT | 0.01 | 0.01 | 0.01 | 0.01 | 0.01 | 0.01 |
| DEHA | 0.02 | 0.02 | 0.02 | 0.02 | 0.02 | 0.02 |
| TOTAL | 100 | 100 | 100 | 100 | 100 | 100 |

Solutions of 50% solids in acetone were coated to form films. The films were tested for sludge formation and photospeed. The results are given in the table below.

| | SAMPLE | | | | | |
|---|---|---|---|---|---|---|
| | 6-1 | 6-2 | 6-3 | 6-4 | 6-5 | 6-6 |
| Sludge | 1 | 1 | 1 | 1 | 3 | 2 |
| Photospeed | | | | | | |
| 40 mJ/cm$^2$ | 24 | | | | 21 | |

-continued

| | SAMPLE | | | | | |
|---|---|---|---|---|---|---|
| | 6-7 | 6-8 | C-6A | C-6B | C-6C | C-6D |
| Sludge Photospeed | 2 | 2 | 8 | 8 | 6 | 6 |
| 40 mJ/cm² | | | 24 | | | |

It is clear from the above data that there is much more sludge formation in the compositions with o-Cl-HABI.

Example 7

A stripper solution is prepared by dissolving 15 g potassium hydroxide in 1 liter of water. To this is added 1.5 ml of Pluronic\31R1 (BASF, Mt. Olive, N.J.), which is a polyoxyethylene/polyoxypropylene copolymer plasticizer. A 12 inch by 12 inch (30.5×30.5 cm) sample of processed, i.e., exposed and developed, photoresist film that is 1.2 mil (30.5 micron) thick, representing 3.4 g of photoresist, is placed in 100 g of the developer solution and is maintained at a temperature of 120–130° F. (50–55° C.). The sample is allowed to sit until the processed photoresist sample has dissolved, and the amount of precipitate is determined according to the same scale used for the samples in developer solution.

Photoresist films on copper FR-4 substrates are prepared using the compositions of Example 1, as described above. These are overall exposed to actinic radiation using the DuPont PC-530 exposure unit and then are treated with the stripper solution as described above. The samples containing o-Cl-HABI have sludge ratings of 5–10, while the samples containing TCDM-HABI have sludge ratings of 0–3.

What is claimed is:

1. A process for the continuous development of photoresist compositions, comprising the steps:
   (a) applying an aqueous-developable photoresist to a surface of a first substrate, said photoresist comprising a photoinitiator;
   (b) imagewise exposing to actinic radiation to produce exposed and non-exposed areas in the photoresist;
   (c) treating the imagewise exposed photoresist with a sample of aqueous alkaline solution, said solution containing less than 5% by weight organic content, resulting in removal of either the exposed or the non-exposed areas of the photoresist; and
   (d) repeating steps (a) to (c) at least 5 times, wherein each repetition uses a new sample of photoresist and a new substrate and essentially the same sample of aqueous alkaline solution;
wherein the photoinitiator comprises at least one hexaarylbiimidazole compound having at least one hydrophilic group, and wherein treatment of 3 grams of unexposed photoresist with 100 grams of the aqueous alkaline solution produces less than 0.05 grams sludge.

2. The process of claim 1 wherein the photoresist further comprises an ethylenically-unsaturated compound, and a binder.

3. The process of claim 1 wherein the hydrophilic group is selected from alkoxy, hydroxy, dialkylamino, carboxyl, carboxyl ester, carboxyl amide, carboxyl salt, and mixtures thereof.

4. The process of claim 1 wherein the hexaarylbiimidazole further has at least one chloro substituent.

5. The process of claim 1 wherein the photoinitiator is selected from 2,2',5-tris-(o-chlorophenyl)-4-(3,4-dimethoxyphenyl)-4',5'-diphenyl-1,1'-biimidazole; 2,2'4,4'-tetra-(o-chlorophenyl)-5,5'-bis-(3,4-dimethoxyphenyl)-1,1'-biimidazole; 2,2'-bis-(o-chlorophenyl)-4,4',5,5'-tetra-(m-methoxyphenyl)-1,1'-biimidazole; and mixtures thereof.

6. The process of claim 1 wherein the photoinitiator comprises an admixture of 2,4,5-triphenylimidazolyl dimers which are the product of 2-(o-chlorophenyl)-4,5-diphenylimidazole and 2,4-bis-(o-chlorophenyl)-5-[3,4-dimethoxyphenyl]-imidazole by oxidative coupling, a reaction product being 2,2',5-tris-(o-chlorophenyl)-4-(3,4-dimethoxyphenyl)-4',5'-diphenyl-1,1'-biimidazole.

7. The process of claim 1 wherein the photoresist further comprises a hydrogen donor compound.

8. The process of claim 2 wherein the photoinitiator comprises 0.1–10% by weight, based on the total weight of the photoresist; the ethylenically unsaturated compound comprises 5–60% by weight, based on the total weight of the photoresist; and the binder comprises 25–90% by weight, based on the total weight of the photoresist.

9. The process of claim 8 wherein the photoinitiator comprises 0.5–3% by weight, based on the total weight of the photoresist.

10. A process for removing a pattern of processed photoresist from a substrate, said process comprising the steps:
    (a) treating the processed photoresist with a sample of a stripper solution, resulting in removal of the processed photoresist; and
    (b) repeating step (a) at least 5 times, wherein each repetition uses a new substrate and processed photoresist and essentially the same sample of stripper solution;
wherein the photoresist comprises at least one hexaarylbiimidazole compound having at least one hydrophilic group, and wherein treatment of 3 grams of processed photoresist with 100 grams of the stripper solution produces less than 0.05 grams sludge.

11. The process of claim 10 wherein the photoresist further comprises an ethylenically-unsaturated compound, and a binder.

12. The process of claim 10 wherein the hydrophilic group is selected from alkoxy, hydroxy, dialkylamino, carboxyl, carboxyl ester, carboxyl amide, carboxyl salt, and mixtures thereof.

13. The process of claim 10 wherein the hexaarylbiimidazole further has at least one chloro substituent.

14. The process of claim 10 wherein the photoinitiator is selected from 2,2',5-tris-(o-chlorophenyl)-4-(3,4-dimethoxyphenyl)-4',5'-diphenyl-1,1'-biimidazole; 2,2'4,4'-tetra-(o-chlorophenyl)-5,5'-bis-(3,4-dimethoxyphenyl)-1,1'-biimidazole; 2,2'-bis-(o-chlorophenyl)-4,4',5,5'-tetra-(m-methoxyphenyl)-1,1'-biimidazole; and mixtures thereof.

15. The process of claim 10 wherein the photoinitiator comprises an admixture of 2,4,5-triphenylimidazolyl dimers which are the product of 2-(o-chlorophenyl)-4,5-diphenylimidazole and 2,4-bis-(o-chlorophenyl)-5-[3,4-dimethoxyphenyl]-imidazole by oxidative coupling, a reaction product being 2,2',5-tris-(o-chlorophenyl)-4-(3,4-dimethoxyphenyl)-4',5'-diphenyl-1,1'-biimidazole.

16. The process of claim 10 wherein the photoresist further comprises a hydrogen donor compound.

17. The process of claim 11 wherein the photoinitiator comprises 0.1–10% by weight, based on the total weight of the photoresist; the ethylenically unsaturated compound comprises 5–60% by weight, based on the total weight of the photoresist; and the binder comprises 25–90% by weight, based on the total weight of the photoresist.

18. The process of claim 17 wherein the photoinitiator comprises 0.5–3% by weight, based on the total weight of the photoresist.

19. The process of claim 10 wherein the stripper solution is an aqueous alkaline solution.

* * * * *